US011574665B2

(12) United States Patent
Carman

(10) Patent No.: US 11,574,665 B2
(45) Date of Patent: Feb. 7, 2023

(54) TIMING CHAINS FOR ACCESSING MEMORY CELLS

(71) Applicant: Micron Technology, Inc., Boise, ID (US)

(72) Inventor: Eric Carman, San Francisco, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/466,655

(22) Filed: Sep. 3, 2021

(65) Prior Publication Data

US 2021/0398576 A1  Dec. 23, 2021

Related U.S. Application Data

(63) Continuation of application No. 16/737,139, filed on Jan. 8, 2020, now Pat. No. 11,127,443.

(51) Int. Cl.
*G11C 7/22* (2006.01)
*G11C 7/06* (2006.01)
(Continued)

(52) U.S. Cl.
CPC .......... *G11C 7/222* (2013.01); *G06F 13/1689* (2013.01); *G11C 7/06* (2013.01); *G11C 11/4093* (2013.01); *G11C 16/26* (2013.01)

(58) Field of Classification Search
CPC ....... G11C 7/222; G11C 7/06; G11C 11/4093; G11C 16/26
See application file for complete search history.

(56) References Cited

U.S. PATENT DOCUMENTS 6,330,636 B1    12/2001   Bondurant et al.
10,141,935 B2   11/2018   Bains et al.
(Continued)

FOREIGN PATENT DOCUMENTS

CN    101276641 A    10/2008
CN    107924693 A    4/2018
(Continued)

OTHER PUBLICATIONS

Chinese Patent Office, "Notification to Grant Patent Right for Invention and Search Report", issued in connection with Chinese Patent Application No. 202110011490.5 dated Jul. 11, 2022 (7 pages).

*Primary Examiner* — Han Yang
(74) *Attorney, Agent, or Firm* — Holland & Hart LLP

(57) ABSTRACT

Methods, systems, and devices for timing chains for accessing memory cells are described to implement some delays at logic circuitry under an array of memory cells. The memory array logic may represent CMOS under array logic circuitry. A bank group logic may generate a first memory operation and a longer delay corresponding to a timing between the first operation and a second operation. The first operation may represent an access operation, a precharging operation, or the like. The memory array logic may be signaled regarding the first operation and may generate one or more smaller delays associated with one or more sub-operations of the first operation. The smaller delays may be tunable, which may support a memory device or controller to implement operations or sub-operations with different timings based on different processes, different memory cell characteristics, or different temperatures, among other examples.

20 Claims, 7 Drawing Sheets

(51) Int. Cl.
  *G06F 13/16* (2006.01)
  *G11C 11/4093* (2006.01)
  *G11C 16/26* (2006.01)

(56) References Cited

U.S. PATENT DOCUMENTS

| | | | |
|---|---|---|---|
| 2007/0156996 A1* | 7/2007 | Chung | G06F 13/1689 |
| | | | 711/167 |
| 2013/0322162 A1 | 12/2013 | Lee et al. | |
| 2017/0270987 A1* | 9/2017 | Matsuoka | G11C 13/0002 |
| 2019/0267059 A1 | 8/2019 | Kim | |
| 2021/0210126 A1 | 7/2021 | Carman | |

FOREIGN PATENT DOCUMENTS

| | | | |
|---|---|---|---|
| CN | 109791783 A | 5/2019 |
| KR | 20080001973 A | 1/2008 |
| WO | WO9858381 A1 | 12/1998 |

\* cited by examiner

TIMING CHAINS FOR ACCESSING MEMORY CELLS

CROSS REFERENCE

The present Application for Patent is a continuation of and claims priority to U.S. patent application Ser. No. 16/737,139 by Carman, entitled "TIMING CHAINS FOR ACCESSING MEMORY CELLS" and filed Jan. 8, 2020, which is assigned to the assignee hereof, and is hereby incorporated by reference in its entirety.

BACKGROUND

The following relates generally to one or more memory systems and more specifically to timing chains for accessing memory cells.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
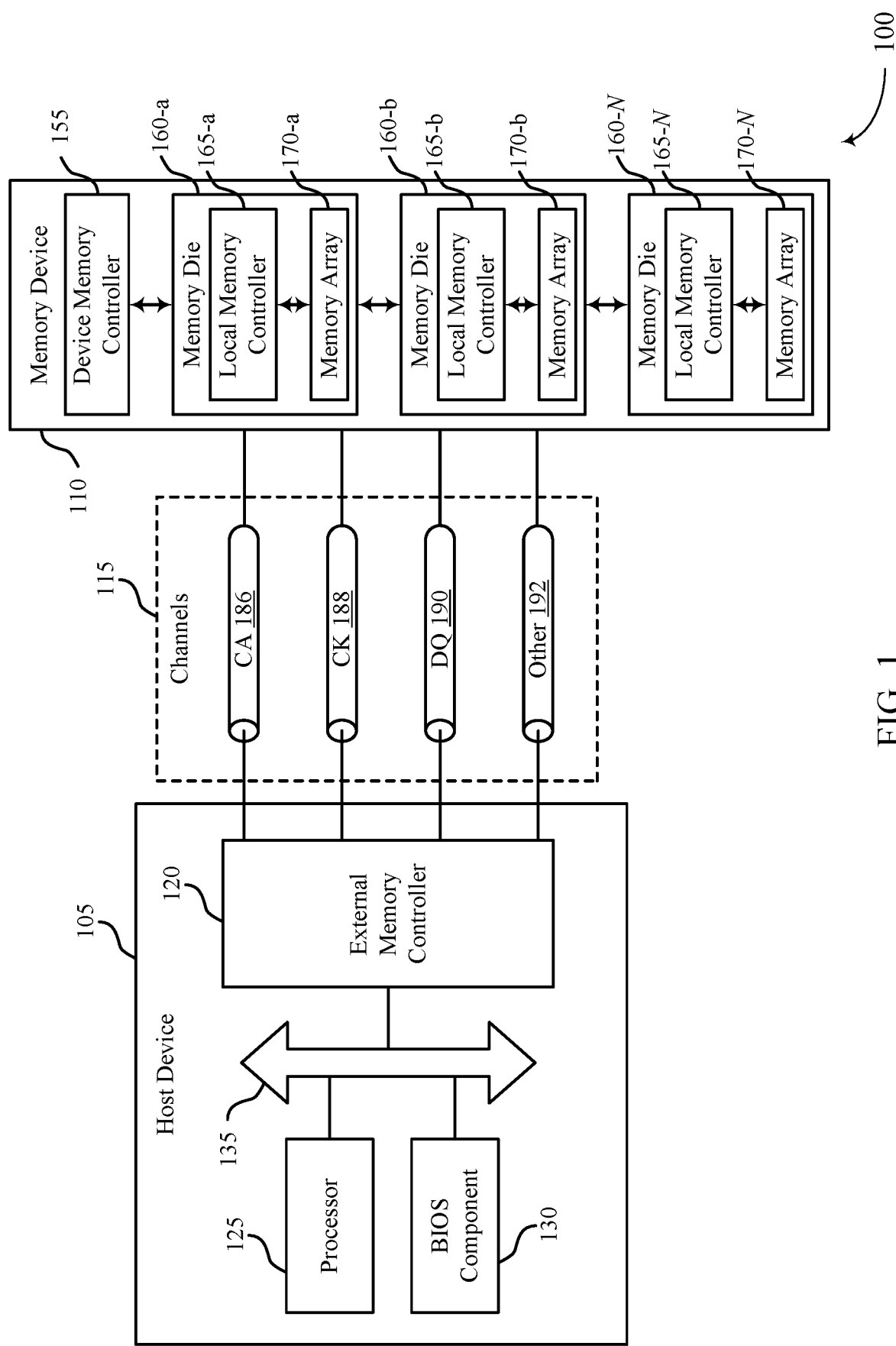
FIG. 1 illustrates an example of a system that supports timing chains for accessing memory cells in accordance with examples as disclosed herein.

A memory device may include one or more memory dies having one or more bank groups. Each bank group may include one or more banks that may include one or more sections that may include one or more memory arrays (e.g., patches). Bank group logic corresponding to a bank group may include one or more circuits to generate timing delays between one or more signals or operations. The bank group logic may transmit commands, signals, and/or operations to one bank or to multiple banks of memory arrays. Specified delays may be introduced by the bank group logic between the one or more transmissions in order to perform operations at a correct time and ensure that a first operation is finished before beginning a second operation (e.g., to allow memory components time to perform actions generated by the one or more transmissions). Section and/or patch logic may include one or more circuits associated with a given section or patch of memory that may receive one or more signals from the bank group logic and determine the delays generated by the bank group logic based on the signaling.

Some memory systems may implement all delays via bank group logic. In some cases, timing circuits associated with the bank group logic may take up a relatively large amount of space (e.g., in order to generate larger timings between operations and signals), which may increase a size of an associated memory device. Additionally, longer delays implemented by bank group logic may not adjust as operating conditions of a memory device change. For example, delays may, in some cases, be more accurate if they are adaptable to different processes, adaptable to how a given memory cell responds to specific inputs, adaptable to temperature considerations, etc.

Accordingly, the present disclosure describes techniques and apparatuses for implementing some delays at patch-level or section-level logic (e.g., via complementary metal oxide semiconductor (CMOS) under array (CuA) logic circuitry). The bank group logic may generate one or more operations (e.g., activate, precharge, etc.) and may generate longer delays corresponding to a timing between the one or more operations. However, smaller delays, based on smaller circuitry (e.g., the CuA logic), may be implemented in logic positioned under a patch or section of memory (e.g., under an array of memory cells). The patch or section logic may receive the one or more operations and may generate smaller operations with smaller delays, where the smaller operations may represent sub-operations corresponding to the one or more operations. The smaller delays generated by patch or section logic may be tunable, which may support a memory device or controller to implement operations or sub-operations with different timings based on different processes, memory cell characteristics, temperatures, etc. Additionally, patch logic or section logic may occupy less space than corresponding bank group logic, which may in turn reduce a footprint of delay logic within a memory die. Generating the smaller delays at the patch or section logic may also reduce a numerical quantity (e.g., number) of sockets, tracks, or wiring within a memory device used to communicate signals to different layers or portions of the memory device.

Features of the disclosure are initially described in the context of memory systems and dies as described with reference to FIGS. 1 and 2. Features of the disclosure are described in the context of a bank group, a timing diagram, and a memory bank as described with reference to FIGS. 3-5. These and other features of the disclosure are further illustrated by and described with reference to an apparatus diagram and a flowchart that relate to timing chains for accessing memory cells as described with references to FIGS. 6-7.

FIG. 1 illustrates an example of a system 100 that supports timing chains for accessing memory cells in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105. In some cases, host device 105 may transmit one or more commands or signals to a memory device 110 in order to perform one or more operations at the memory device 110 (e.g., a read operation, write operation, etc.).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory dies 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110, such as the one or more signals and/or commands for the memory device to perform one or more operations. Each channel 115 may be examples of transmission mediums that carry information between the host device 105 and the memory device. Each channel 115 may include one or more signal paths or transmission media (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

A bank group logic of a memory die 160 may generate one or more operations (e.g., activate, precharge, etc.) and may generate longer delays corresponding to a timing between the one or more operations. Smaller delays, based on smaller circuitry (e.g., CuA logic), may be implemented in logic positioned under a patch or section of memory (e.g., under an array of memory cells). The patch logic or section logic may receive the one or more operations and may generate smaller operations with smaller delays, where the smaller operations may represent sub-operations or steps corresponding to the one or more operations. Generating smaller delays at patch-level logic or section-level logic may provide advantages by occupying less memory die space, by reducing a numerical quantity of tracks and sockets, and by supporting adjustable delays at a bank, section, or patch level.

Figure 2:
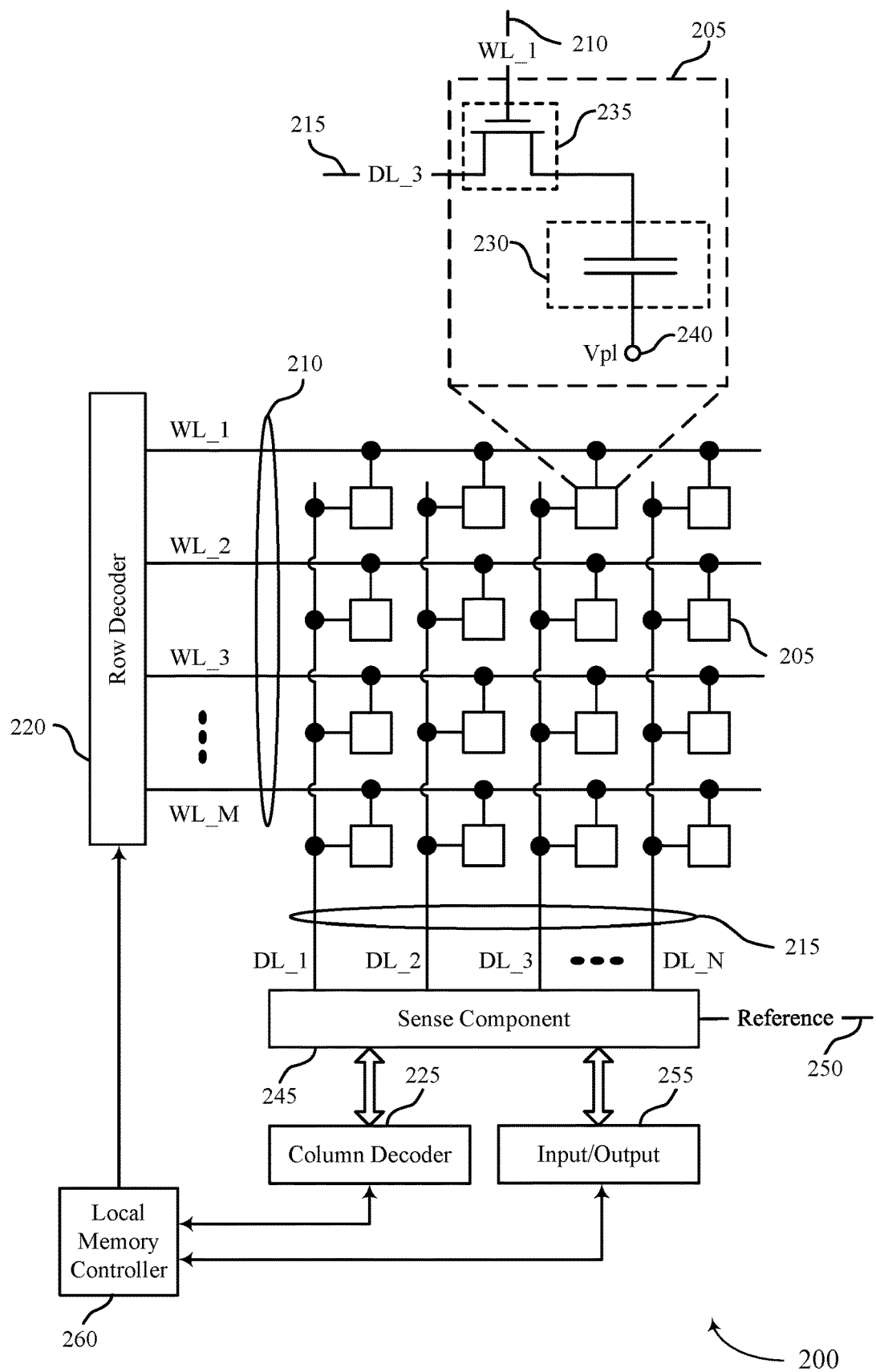
FIG. 2 illustrates an example of a memory array that supports timing chains for accessing memory cells in accordance with examples as disclosed herein.

FIG. 2 illustrates an example of a memory array 200 that supports timing chains for accessing memory cells in accordance with examples as disclosed herein. The memory array 200 may be an example of the memory arrays 170 described with reference to FIG. 1. In some examples, the memory array 200 may be included in a memory chip, a memory device, or an electronic memory apparatus. The memory array 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory array 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations, such as reading and writing, may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. In some cases, access operations may be received by a bank group (e.g., from a host device or a portion of a memory device) and communicated to one or more banks of memory arrays, such that the one or more banks of memory arrays may perform the access operations.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be operable to couple and/or isolate the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory array 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory array 200), translate the commands or the data (or both) into information that can be used by the memory array 200, perform one or more operations on the memory array 200, and communicate data from the memory array 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory array 200. In general, the amplitude, the shape, or the duration of an applied voltage or current discussed herein may be varied and may be different for the various operations discussed in operating the memory array 200.

The local memory controller 260 may be operable to perform one or more access operations on one or more memory cells 205 of the memory array 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory array 200 that are not directly related to accessing the memory cells 205.

The local memory controller 260 may be operable to perform a write operation (e.g., a programming operation) on one or more memory cells 205 of the memory array 200. During a write operation, a memory cell 205 of the memory array 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory array 200. During a read operation, the logic state stored in a memory cell 205 of the memory array 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

A bank group logic of a memory die may generate one or more operations (e.g., activate, precharge, etc.) and may generate longer delays corresponding to a timing between the one or more operations. Smaller delays, based on smaller circuitry (e.g., CuA logic), may be implemented in logic positioned under a patch or section of memory (e.g., under a memory array 200). The patch logic or section logic may receive the one or more operations and may generate smaller operations with smaller delays, where the smaller operations may represent sub-operations or steps corresponding to the one or more operations. Generating smaller delays at patch-level or section-level logic may provide advantages by occupying less memory die space, by reducing a numerical quantity of tracks and sockets, and by supporting adjustable delays at a bank, section, or patch level.

Figure 3:
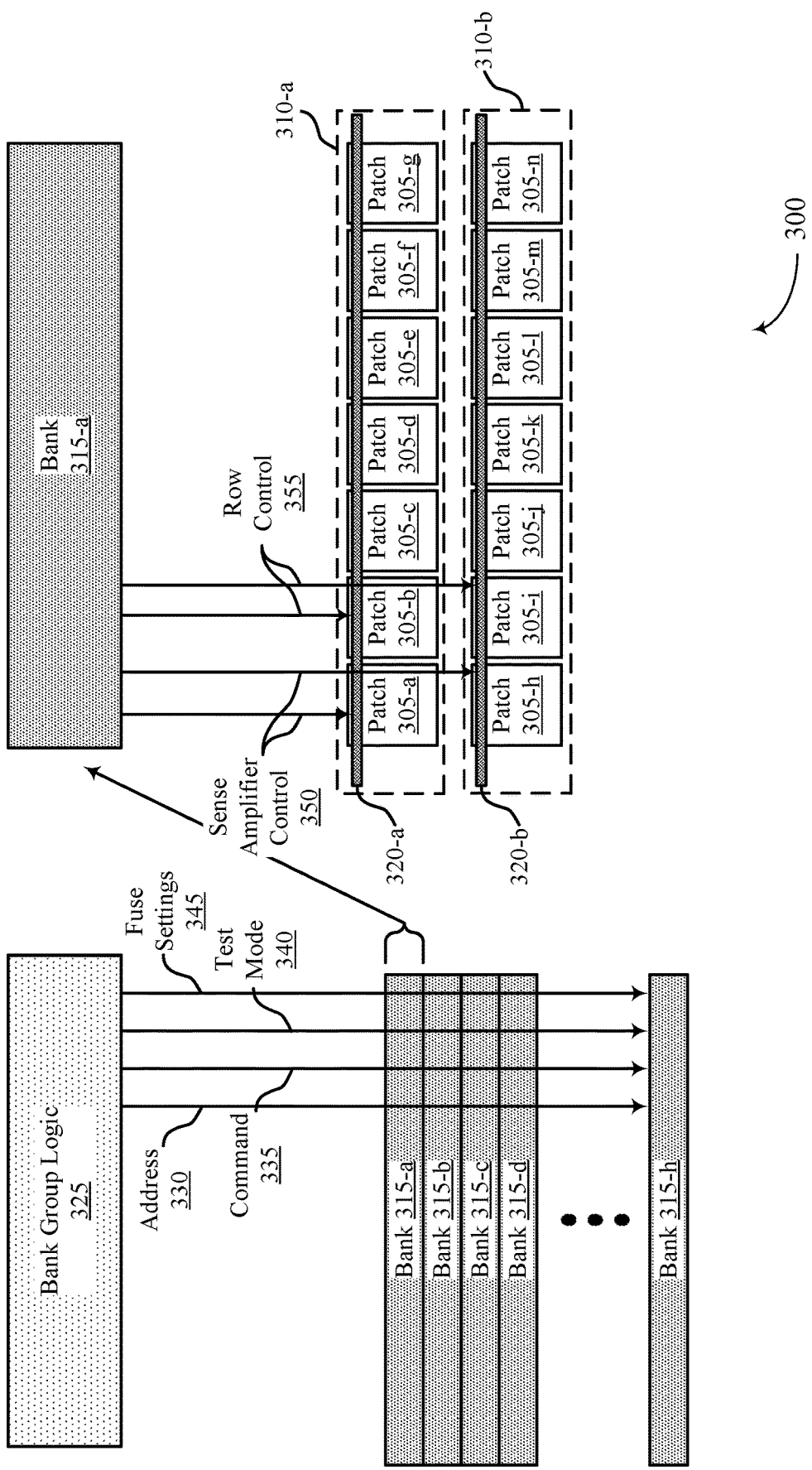
FIG. 3 illustrates an example of a bank group that supports timing chains for accessing memory cells in accordance with examples as disclosed herein.

FIG. 3 illustrates an example of a bank group 300 that supports timing chains for accessing memory cells in accordance with examples as disclosed herein. A bank group, such as the bank group 300, may represent a unit of memory included in a memory die, where the memory die may be an example of a memory die described with reference to FIG. 1. A memory die may include one or more bank groups 300, and in some cases, a bank group 300 may be a largest addressable memory unit of a memory die. In some cases, multiple bank groups 300 may be accessed in parallel in order to maintain a specified bandwidth when performing an operation with a longer access time (e.g., a precharge operation). Each bank group may include a memory array, which may be an example of a memory array described with reference to FIGS. 1 and 2.

A patch 305 may include or represent an array of memory cells, such as a memory array described with reference to FIG. 2. For example, a patch 305 may be a size of a memory cell array that is repeated to make a bank 315. Operational circuits (e.g., word line or bit line drivers, sense amplifiers, etc.) may be located under a patch 305 and may be independent or may be shared among patches 305. In some cases, the operational circuits may be examples of CuA. A section 310 may include one or more patches 305 (e.g., a row of patches 305), which may be addressable via a section bus 320. In some cases, when a section 310 is accessed, each patch 305 of the section 310 may be turned on. A bank 315 of memory may include one or more sections 310, and in turn, a bank group 300 may include one or more banks 315. A bank 315 may (e.g., using a single circuit or multiple circuits working collectively) latch address signals (e.g., via an address latch), may load fuse trim settings for local row address strobes (RAS), and may load test mode signals. A bank 315 may also include one or more drivers.

A bank group logic 325 corresponding to the bank group 300 may include one or more circuits to generate timing delays between one or more signals or operations. The bank group logic 325 may transmit one or more of an address 330, a command 335, a test mode 340, or fuse settings 345, among other examples of signal or operations, to one bank 315 or to multiple banks 315. Specified delays may be introduced by the bank group logic 325 between the one or more signals in order to perform operations at a correct time and ensure that an operation is finished before beginning another operation (e.g., to allow memory components time to perform actions between the one or more signals). Section and/or patch logic may include one or more circuits associated with a given section 310 or patch 305. Section logic or patch logic may receive one or more signals from the bank group logic 325 via a respective bank 315 and determine the delays generated by the bank group logic 325 based on the relayed signaling.

In some examples, a memory die may include eight bank groups 300 and a bank group 300 may include eight banks 315 (e.g., banks 315-*a* through 315-*h*). A bank 315-*a* may include sections 310-*a* and 310-*b*, where section 310-*a* may include patches 305-*a* through 305-*g* and section 310-*b* may include patches 305-*h* through 305-*n*. In some cases, a bank 315 may include four sections 310. When accessing the bank groups 300 in parallel, a memory die with eight bank groups 300 and eight banks 315 in each group may operate using 64-bank parallelism. While this specific example is described herein, it is to be understood that a bank group 300 may include any numerical quantity of banks 315, a bank 315 may include any numerical quantity of sections 310, and a section 310 may include any numerical quantity of patches 305.

In some examples, the bank group logic 325 may transmit a command 335 to one or more banks 315, including bank 315-*a*. The command 335 may include, for example, one or more of a sense amplifier control 350 or a row control 355. The sense amplifier control 350 and/or row control 355 may be received by or forwarded to sections 310-*a* and 310-*b* (e.g., via respective section buses 320-*a* and 320-*b*), such that the patches 305-*a* through 305-*n* may receive and act on the commands.

Some memory systems may implement delays via bank group logic 325. In some cases, timing circuits associated with the bank group logic 325 may take up a relatively large amount of space (e.g., in order to generate larger timings between operations and signals), which may increase a size of an associated memory device. Additionally, longer delays implemented by bank group logic 325 may not adjust as operating conditions of a memory device change. For example, delays may, in some cases, be more accurate if they are adaptable to different processes, adaptable to how a given memory cell responds to specific inputs, adaptable to temperature considerations, etc.

Accordingly, the present disclosure describes techniques and apparatuses for implementing some delays at patch or section-level logic (e.g., CuA logic). Longer delays associated with different operations may be implemented by the bank group logic 325 for a bank group 300. However, smaller delays, based on smaller circuitry (e.g., CuA logic), may be implemented in logic positioned under a patch 305 (e.g., under an array of memory cells). In some cases, patch logic may also be shared across a section 310, which may be referred to as section logic. The smaller delays generated by patch or section logic may be tunable, which may support a memory device or controller to implement operations or sub-operations with different timings based on different processes, memory cell characteristics, temperatures, etc. Additionally, patch or section logic may occupy less space than corresponding bank group logic 325, which may in turn reduce a footprint of delay logic within a memory die. Generating the smaller delays at the patch or section logic may also reduce a numerical quantity of sockets, tracks, or wiring within a memory device used to communicate signals to different layers or portions of the memory device.

The smaller delays generated by patch logic or section logic may correspond to one or more portions of a command, operation, or signal with longer delays generated by the bank group logic 325 (e.g., generated from one or more channel inputs). For example, the bank group logic 325 may generate one or more operations (e.g., activate, precharge, etc.) and may generate longer delays corresponding to a timing between the one or more operations. The patch or section logic may receive the one or more operations (e.g., via a respective bank 315) and may generate smaller operations with smaller delays, where the smaller operations may represent sub-operations or steps corresponding to the one or more operations. These and other methods may provide advantages by occupying less memory die space, by reducing a numerical quantity of tracks and sockets, and by supporting adjustable delays at a bank, section, or patch level.

Figure 4:
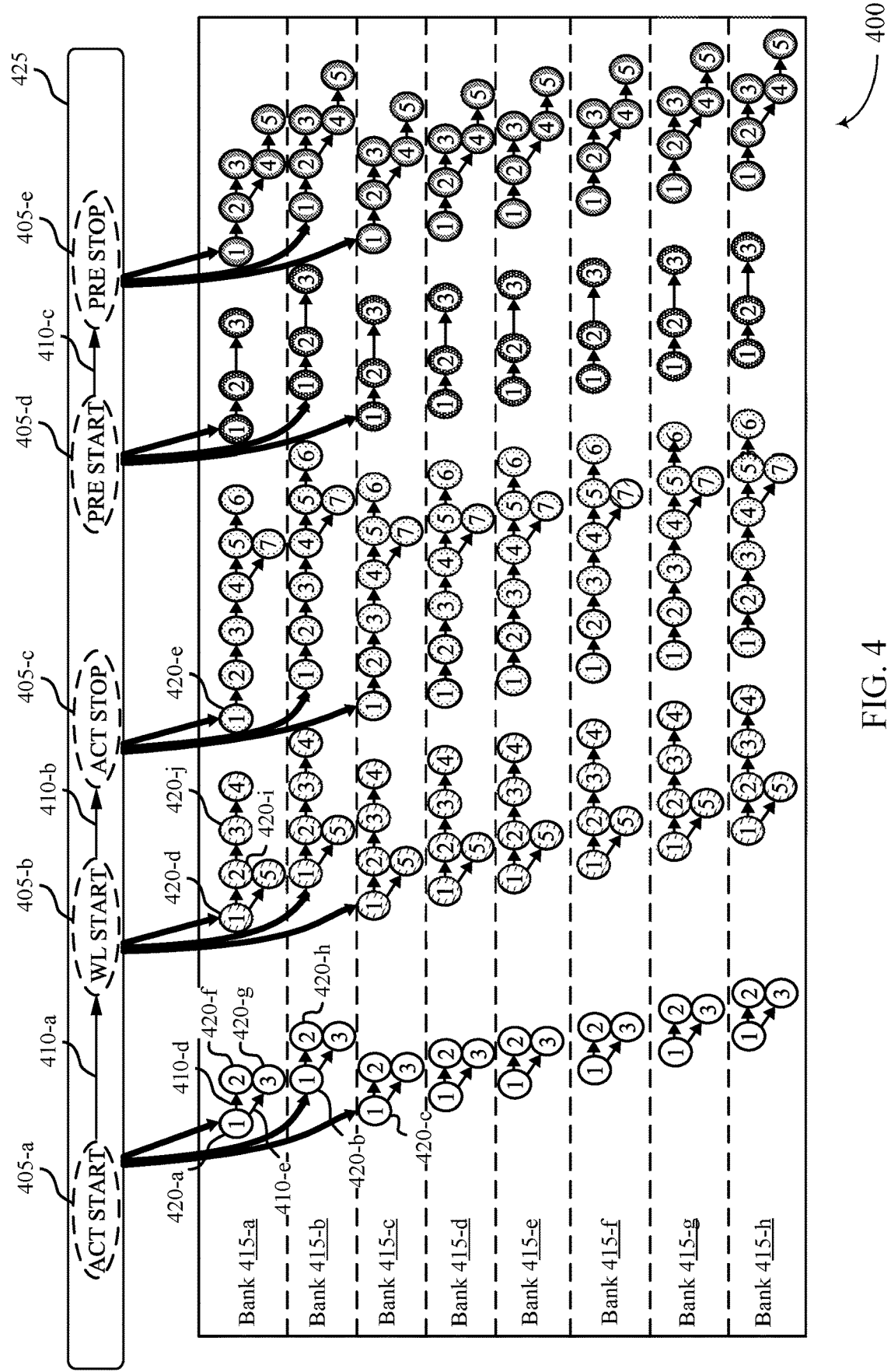
FIG. 4 illustrates an example of a timing diagram that supports timing chains for accessing memory cells in accordance with examples as disclosed herein.

FIG. 4 illustrates an example of a timing diagram 400 that supports timing chains for accessing memory cells in accordance with examples as disclosed herein. Timing diagram 400 may implement aspects of bank group 300 described with reference to FIG. 3. For example, operations 405 and associated delays 410 may be generated by bank group logic 425 associated with a bank group, which may be an example of the bank group logic described with reference to FIG. 3. The operations 405 may be communicated to one or more banks 415, which may be examples of memory banks described with reference to FIG. 3. For example, each bank 415 may include one or more sections, and each section may include one or more patches (e.g., memory arrays). The banks 415 may be included in a bank group, which in turn may be included in a memory die of a memory device.

An operation 405 may be or include one or more processes that may be performed in association with a memory device or a memory array (e.g., associated with reading, writing, or performing other operations on a memory cell). For example, an operation 405 may be or include an activate operation, a precharge operation, or a word line start operation, among other examples. An operation 405 may also be associated with one or more sub-operations 420. A sub-operation 420 may be or include one or more steps or methods included in an associated operation 405, where performing the one or more sub-operations may result in performing the associated operation 405. A sub-operation 420 may be associated with a specific timing (e.g., a rising or falling edge of a clock signal) that may represent a defined time for completing one or more methods or procedures of the associated operation 405.

The bank group logic 425 may generate one or more operations 405 and associated delays 410 (e.g., larger delays 410) between the operations 405 for a bank group, as already described with reference to FIG. 3. The operations 405 and associated delays 410 may be generated in response to information received by the bank group logic 425 via a channel (e.g., from a host device or another portion of a memory device). The operations 405 and/or delays 410 may be communicated to one or more banks 415 of the bank group (e.g., via one or more signals), where the signals may trigger generation of one or more sub-operations 420 and associated smaller delays 410 at section or patch logic (e.g., CuA logic). In some cases, the larger delays 410 generated by the bank group logic 425 (e.g., delays 410-a, 410-b, or 410-c) may be considered global delays 410 or global timing events (e.g., with respect to the bank group), which in some cases may depend on or be generated from timing associated with periphery logic circuits (e.g., and communicated via the channel). In some cases, the smaller delays 410 generated by the section or patch logic may be considered local delays 410 or local timing events because the delays 410 and corresponding timing may be produced by local logic circuitry.

A first sub-operation 420 of an operation 405 in a given bank 415 (e.g., sub-operations 420-a, 420-b, 420-c, 420-d, 420-e, etc.) may be generated by one or more global delays 410 (e.g., generated by the bank group logic 425). Subsequent sub-operations 420 (e.g., sub-operations 420-f, 420-g, 420-h, 420-i, 420-j, etc.) may be generated by one or more local delays 410 (e.g., by section or patch logic). The bank group logic 425 may generate the one or more global delays 410 using a resistor-capacitor (RC) circuit, one or more oscillators, or a combination thereof. Similarly, patch or section logic may generate the one or more local delays 410 using an RC circuit, one or more oscillators, or a combination thereof. The components used to generate the smaller delays at the patch logic or section logic may be smaller than other components used to generate the larger delays because the smaller delays may have shorter durations than the larger delays. In some cases, an oscillator may be or include a proportional to absolute temperature (PTAT) oscillator or a complementary to absolute temperature (CTAT) oscillator. As such, timings and delays 410 generated by the bank group logic 425 may adjust to a temperature of the bank group and local timing and delays 410 generated by the patch or section logic may adjust to a local temperature of an associated patch and/or section.

In some examples, a first operation 405 generated by the bank group logic 425 (e.g., in response to a command received via a channel) may be an activate start operation 405-a. The bank group logic 425 may communicate the operation 405-a to one or more banks 415 of the bank group and may generate a first delay 410-a (e.g., 21.5 nanoseconds (ns)) until a next operation 405-b may start. In some cases, the bank group logic 425 may generate first delay 410-a using an RC circuit and an oscillator (e.g., a PTAT or CTAT). For example, the RC circuit may generate a first, shorter portion of the first delay 410-a (e.g., 1 to 5.5 ns) and the oscillator may generate a second, longer portion of the first delay 410-a (e.g., 1 to 80 ns). In some cases, a portion of a delay 410 generated by an RC circuit and by an oscillator may be based on a type of operation 405. Thus, an RC circuit and an oscillator may generate specific portions of delay 410-a of activate start operation 405-a, and an RC circuit and an oscillator may generate different portions of delay 410-b of a word line start operation 405-b.

A bank 415-a (e.g., patch or section logic of the bank 415-a) may receive an indication of the operation 405-a from the bank group logic 425 and the patch or section logic of the bank 415-a may generate a first sub-operation 420-a.

In an example, a sub-operation 420 may represent a procedure such as activating a transistor, a switch, etc., applying a voltage to one or more components, or activating a latch, among other examples. The patch or section logic may generate second and third local delays 410-*d* and 410-*e* (e.g., 1.5 ns), followed by second and third sub-operations 420-*f* and 420-*g*, respectively. In a similar manner, the bank group logic 425 may generate operations 405-*b*, 405-*c*, 405-*d*, and 405-*e* and corresponding delays 410-*b* and 410-*c*, while section and/or patch logic may then generate corresponding sub-operations 420 and associated smaller delays 410. In some examples, delay 410-*b* may represent a delay of 32 ns and delay 410-*c* may represent a delay of 31 ns.

Operations 405-*b* through 405-*e* may respectively begin first sub-operations 420 within one or more banks 415 of the bank group (e.g., via respective patch or section logic) and the respective patch or section logic may generate one or more smaller delays 410 and one or more following sub-operations 420. In some cases, a smaller or local delay 410 may represent a delay of 1 ns, 1.5 ns, 2 ns, or 10 ns, among other examples. In some cases, one or more smaller delays 410 may be defined and stored in a register (e.g., a mode register) of the memory device, and implementing a smaller delay 410 may include identifying the smaller delay 410 from the register. By using registers to generate the smaller delays, the duration of the smaller delays 410 may be tuned, for example, in response to changes in operating conditions such as different delays based on different processes, memory cell characteristics, temperatures, memory cell wear, etc.

Figure 5:
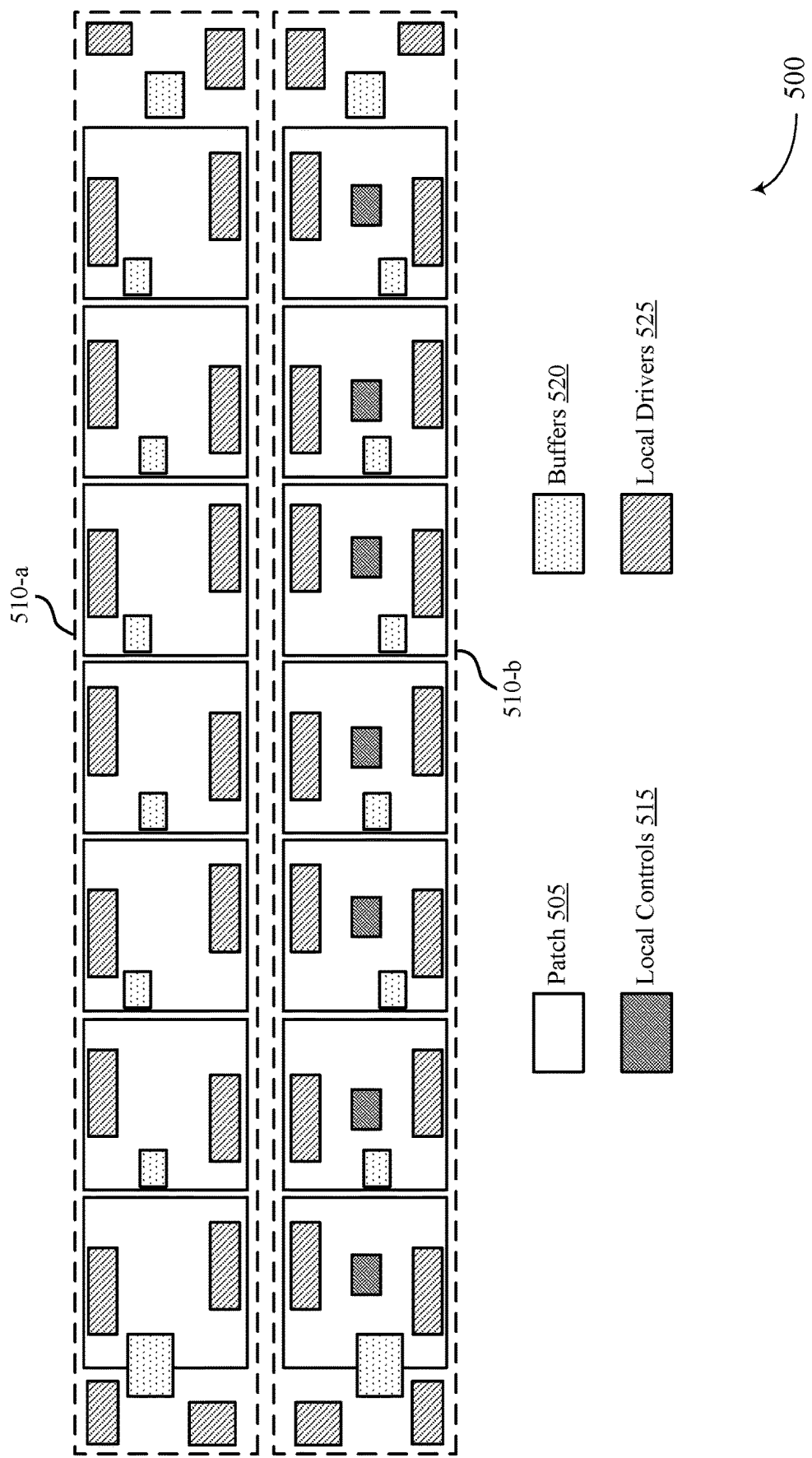
FIG. 5 illustrates an example of a memory bank that supports timing chains for accessing memory cells in accordance with examples as disclosed herein.

FIG. 5 illustrates an example of a memory bank 500 that supports timing chains for accessing memory cells in accordance with examples as disclosed herein. Memory bank 500 may be or include an example of a memory bank described with reference to FIGS. 3 and 4. Memory bank 500 may implement one or more aspects of bank group 300 or timing diagram 400, as described with reference to FIGS. 3 and 4, respectively. For example, memory bank 500 may include one or more sections 510, where a section 510 may include one or more patches 505, as described with reference to FIG. 3. Memory bank 500 may further implement one or more operations and/or sub-operations as described with reference to FIG. 4 (e.g., using one or more components of a section 510 or a patch 505).

A patch may include circuits (e.g., patch or section logic, such as CuA) including one or more local controls 515, one or more buffers 520, and/or one or more local drivers 525. Local controls 515 may include one or more local RAS, local sense amplifier controls, and/or local row controls. In some cases, local controls 515 may be shared across one or more sections 510 and may be divided among respective patches 505 of the one or more sections 510. In some cases, the local controls 515 may include one or more sense amplifiers, comparators, and/or other electronic devices. Buffers 520 may be located near a socket (e.g., to simplify a communication and/or signaling structure). In some examples, one or more buffers 520 may make up a section buffer (e.g., described with reference to FIG. 3) Local drivers 525 may include one or more local sense amplifier drivers and/or local row drivers (e.g., plate and word line drivers).

One or more of the local controls 515, buffers 520, and local drivers 525 may be used to generate local delays (e.g., local timing), such as the shorter delays associated with sub-operations described with reference to FIG. 4. In some cases, circuits represented by the local controls 515, buffers 520, and local drivers 525 may work across a section 510 to generate local delays. For example, although the circuits may be distributed across multiple patches 505, the circuits may work together across patches 505 to generate local delays. Additionally or alternatively, the circuits within a patch 505 may generate a local delay without working with one or more other circuits in another patch 505.

The local controls 515 may receive signals (e.g., common signals such as an address, timing, test mode, and/or fuse inputs) from a bank group logic. The local controls 515 may then drive buffers 520 and local drivers 525 within the memory bank 500 (e.g., within the patches 505 of the memory bank 500). For example, local controls 515 may receive a signal (e.g., a command, operation, or sub-operation) and may route information from the signal to one or more corresponding buffers 520. The information may then be routed from the one or more corresponding buffers 520 to one or more corresponding local drivers 525.

In some examples, the logic for generating the small delays may distributed across a plurality of patches in a section or in a plurality of patches in a bank. In one example, the memory bank 500 may include two sections 510-*a* and 510-*b*, and each section 510 may include seven patches 505. In some cases, the local controls 515 may be included in one of the sections 510 (e.g., section 510-*b*), and in some other cases, the local controls 515 may be included in each of the sections 510. Each patch of the sections 510-*a* and 510-*b* may also include at least a portion of one or more local drivers 525 and buffers 520. In the example where the local controls 515 are included in section 510-*b*, the local controls 515 may receive a signal (e.g., a command, operation, or sub-operation) and may route information from the signal to one or more buffers 520 in either or both of sections 510-*a* and 510-*b*. The one or more buffers 520 may be indicated via the signal, may be determined by the local controls 515, or both. The information may then be routed from the one or more buffers 520 to one or more local drivers 525 based on information in the signal or determined the local controls 515, or both. The one or more local drivers 525 may then carry out one or more portions of a sub-operation that corresponds to the signal.

Figure 6:
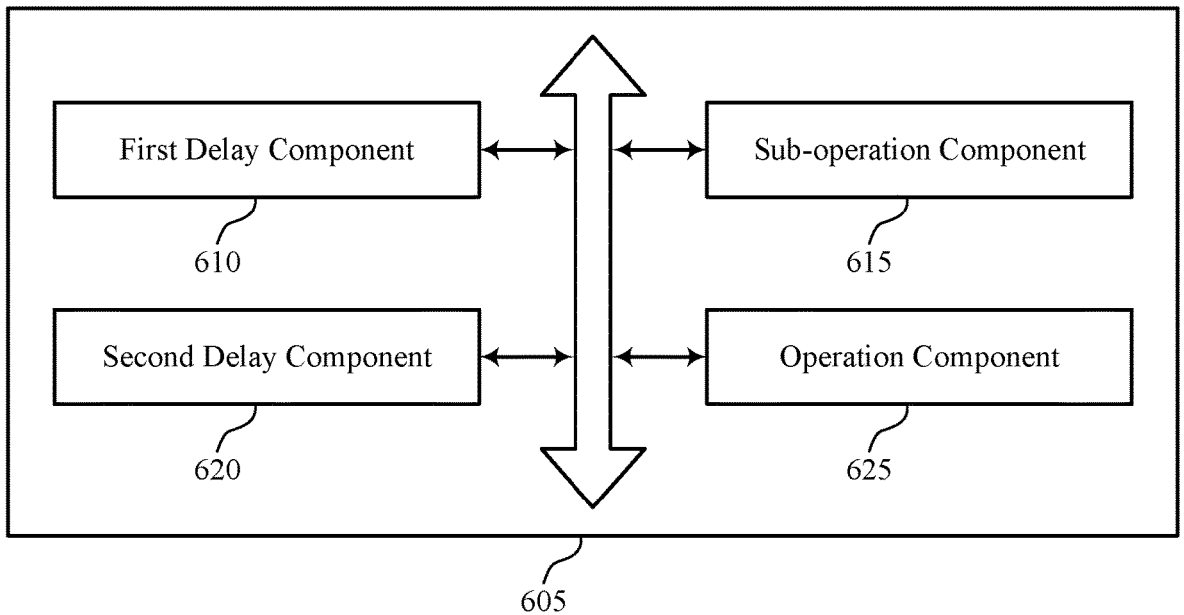
FIG. 6 shows a block diagram of a memory device that supports timing chains for accessing memory cells in accordance with examples as disclosed herein.

FIG. 6 shows a block diagram 600 of a memory device 605 that supports timing chains for accessing memory cells in accordance with examples as disclosed herein. The memory device 605 may be an example of aspects of a memory device as described with reference to FIGS. 1-5. The memory device 605 may include a first delay component 610, a sub-operation component 615, a second delay component 620, and an operation component 625. Each of these modules may communicate, directly or indirectly, with one another (e.g., via one or more buses).

The first delay component 610 may implement, using bank group logic associated with a bank group, a first delay between operations performed using one or more banks of the bank group. In some cases, the first delay includes the first duration between initiating the operation and initiating a second operation different than the operation.

The sub-operation component 615 may initiate a first sub-operation of an operation performed using the one or more banks of the bank group based on implementing the first delay. In some examples, initiating a set of sub-operations of the operation based on implementing the first delay, where the set of sub-operations includes the first sub-operation and the second sub-operation.

The second delay component 620 may implement, using logic associated with a bank of the bank group, a second delay between the first sub-operation of the operation and a second sub-operation of the operation based on initiating the first sub-operation, the first delay having a first duration longer than a second duration of the second delay. In some examples, the second delay component 620 may identify the second delay using a register of a memory device, where implementing the second delay is based on identifying the second delay using the register.

In some examples, the second delay component 620 may implement, using the logic associated with the bank of the bank group, a respective second delay for each sub-operation of the set of sub-operations based on initiating the set of sub-operations, where performing the operation is based on initiating the set of sub-operations.

In some cases, the logic is positioned under an array of memory cells as part of a CuA logic. In some cases, the second delay includes the second duration between initiating the first sub-operation of the operation and the second sub-operation of the operation. In some cases, the logic is associated with a patch of the bank of the bank group.

The operation component 625 may perform the operation based on initiating the first sub-operation of the operation. In some examples, the operation component 625 may receive, from a host device, a command to perform the operation using an array of memory cells, where implementing the first delay is based on receiving the command.

Figure 7:
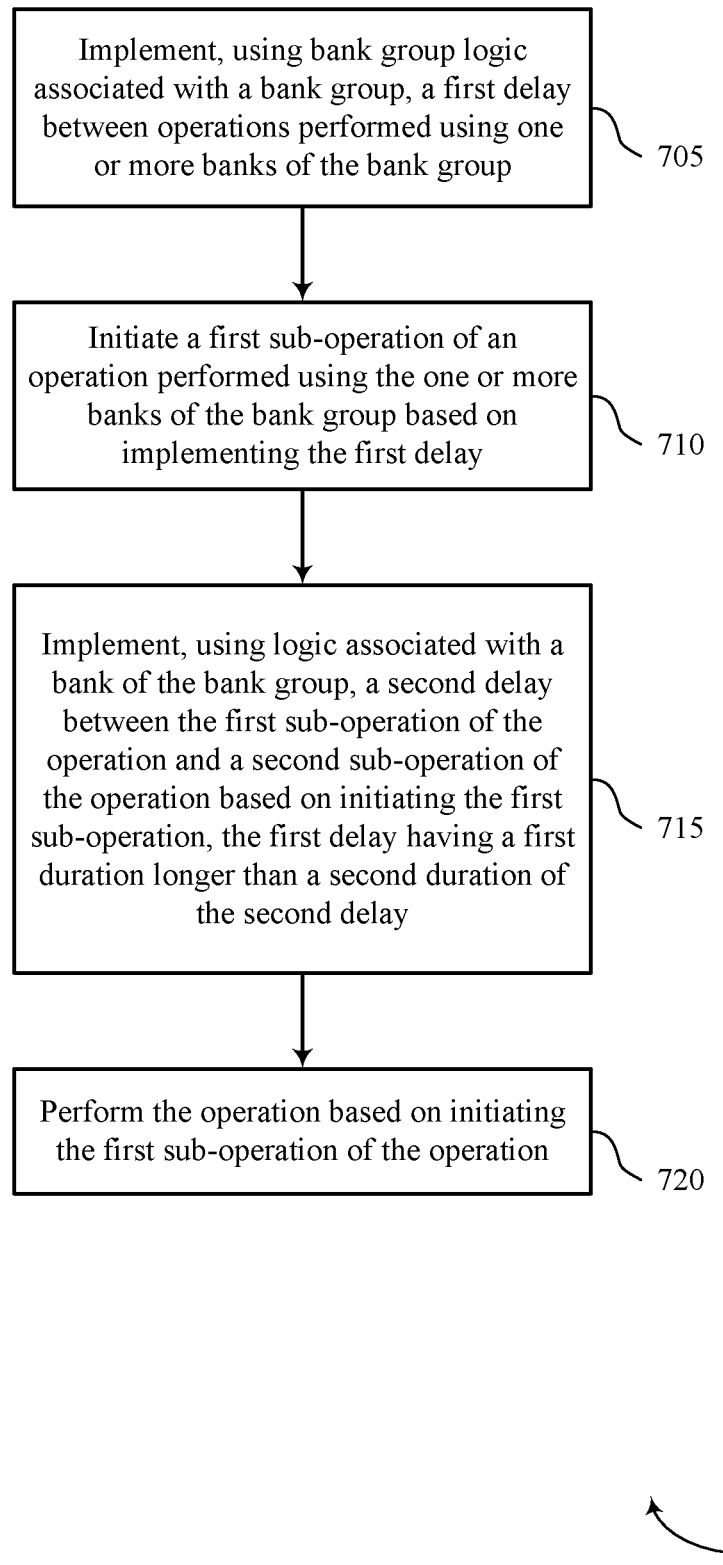
FIG. 7 shows a flowchart illustrating a method or methods that support timing chains for accessing memory cells in accordance with examples as disclosed herein.

FIG. 7 shows a flowchart illustrating a method or methods 700 that supports timing chains for accessing memory cells in accordance with examples as disclosed herein. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 705, the memory device may implement, using bank group logic associated with a bank group, a first delay between operations performed using one or more banks of the bank group. The operations of 705 may be performed according to the methods described herein. In some examples, aspects of the operations of 705 may be performed by a first delay component as described with reference to FIG. 6.

At 710, the memory device may initiate a first sub-operation of an operation performed using the one or more banks of the bank group based on implementing the first delay. The operations of 710 may be performed according to the methods described herein. In some examples, aspects of the operations of 710 may be performed by a sub-operation component as described with reference to FIG. 6.

At 715, the memory device may implement, using logic associated with a bank of the bank group, a second delay between the first sub-operation of the operation and a second sub-operation of the operation based on initiating the first sub-operation, the first delay having a first duration longer than a second duration of the second delay. The operations of 715 may be performed according to the methods described herein. In some examples, aspects of the operations of 715 may be performed by a second delay component as described with reference to FIG. 6.

At 720, the memory device may perform the operation based on initiating the first sub-operation of the operation. The operations of 720 may be performed according to the methods described herein. In some examples, aspects of the operations of 720 may be performed by an operation component as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for implementing, using bank group logic associated with a bank group, a first delay between operations performed using one or more banks of the bank group, initiating a first sub-operation of an operation performed using the one or more banks of the bank group based on implementing the first delay, implementing, using logic associated with a bank of the bank group, a second delay between the first sub-operation of the operation and a second sub-operation of the operation based on initiating the first sub-operation, the first delay having a first duration longer than a second duration of the second delay, and performing the operation based on initiating the first sub-operation of the operation.

Some examples of the method 700 and the apparatus described herein may further include operations, features, means, or instructions for identifying the second delay using a register of a memory device, where implementing the second delay may be based on identifying the second delay using the register.

Some examples of the method 700 and the apparatus described herein may further include operations, features, means, or instructions for receiving, from a host device, a command to perform the operation using an array of memory cells, where implementing the first delay may be based on receiving the command.

Some examples of the method 700 and the apparatus described herein may further include operations, features, means, or instructions for initiating a set of sub-operations of the operation based on implementing the first delay, where the set of sub-operations includes the first sub-operation and the second sub-operation, and implementing, using the logic associated with the bank of the bank group, a respective second delay for each sub-operation of the set of sub-operations based on initiating the set of sub-operations, where performing the operation may be based on initiating the set of sub-operations.

In some examples of the method 700 and the apparatus described herein, the logic may be positioned under an array of memory cells as part of a CuA logic. In some examples of the method 700 and the apparatus described herein, the first delay includes the first duration between initiating the operation and initiating a second operation different than the operation. In some examples of the method 700 and the apparatus described herein, the second delay includes the second duration between initiating the first sub-operation of the operation and the second sub-operation of the operation. In some examples of the method 700 and the apparatus described herein, the logic may be associated with a patch of the bank of the bank group.

It should be noted that the methods described above describe possible implementations, and that the operations and the steps may be rearranged or otherwise modified and that other implementations are possible. Further, portions from two or more of the methods may be combined.

An apparatus is described. The apparatus may include bank group logic operable to control one or more operations of a set of banks of a bank group and operable to implement a first delay between operations performed using the set of banks of the bank group, a bank of the bank group including an array of memory cells, and logic associated with the bank of the bank group and operable to implement a second delay between sub-operations of an operation performed using the bank of the bank group.

Some examples of the apparatus may include a register to store information associated with the second delay, where the logic associated with the bank may be operable to identify the information stored in the register as part of implementing the second delay. In some examples, the logic associated with the bank may be positioned under the array of memory cells as part of a CuA logic. In some examples, the logic further may include operations, features, means, or instructions for a local row control logic to identify the second delay, a buffer to receive the second delay identified by the local row control logic, a local sense amplifier control logic to amplify a signal associated with the second delay identified by the local row control logic, and a row driver to initiate sub-operations of the operation based on the second delay stored in the buffer and the signal amplified by the local sense amplifier control logic. In some examples, the local row control logic and the local sense amplifier control logic may be distributed under two or more patches of the bank of the bank group.

In some examples, the bank group includes the set of banks, each bank of the set of banks includes one or more sections, and each section of the one or more sections includes one or more patches. In some examples, the logic may be associated with a section of the bank. In some examples, the logic may be associated with a patch of the bank. In some examples, the bank group logic further may include operations, features, means, or instructions for an oscillator operable to implement the first delay. In some examples, the bank group logic further may include operations, features, means, or instructions for a resistor-capacitor circuit to implement the first delay. In some examples, the logic further may include operations, features, means, or instructions for an oscillator operable to implement the second delay. In some examples, the logic further may include operations, features, means, or instructions for a resistor-capacitor circuit to implement the second delay.

An apparatus is described. The apparatus may include a bank group including a set of banks, bank group logic operable to control one or more operations of the set of banks, logic associated with a bank of the bank group, and a controller coupled with the bank group, the bank group logic, and the logic and operable to cause the apparatus to implement, using the bank group logic associated with the bank group, a first delay between the one or more operations performed using the set of banks of the bank group, initiate a first sub-operation of an operation performed using the set of banks based on implementing the first delay, implement, using the logic, a second delay between the first sub-operation of the operation and a second sub-operation of the operation based on initiating the first sub-operation, the first delay having a first duration longer than a second duration of the second delay, and perform the operation based on initiating the first sub-operation of the operation.

Some examples may further include identifying the second delay using a register of a memory device, where implementing the second delay may be based on identifying the second delay using the register. Some examples may further include receiving, from a host device, a command to perform the operation using an array of memory cells, where implementing the first delay may be based on receiving the command. Some examples may further include initiating a set of sub-operations of the operation based on implementing the first delay, where the set of sub-operations includes the first sub-operation and the second sub-operation, and implement, using the logic, a respective second delay for each sub-operation of the set of sub-operations based on initiating the set of sub-operations, where performing the operation may be based on initiating the set of sub-operations. In some examples, the logic may be positioned under an array of memory cells as part of a CuA logic.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a plurality of banks of a bank group; and
   logic associated with a bank of the bank group, wherein the logic comprises:
      local row control logic operable to identify a delay between sub-operations of an operation for the bank;
      a buffer operable to receive the delay identified by the local row control logic;
      local sense amplifier control logic operable to amplify a signal associated with the delay identified by the local row control logic; and
      a driver operable to initiate one or more of the sub-operations of the operation based at least in part on the delay stored in the buffer and the signal amplified by the local sense amplifier control logic.

2. The apparatus of claim 1, wherein:
   the bank comprises one or more sections; and
   each section of the one or more sections comprises one or more patches.

3. The apparatus of claim 2, wherein the logic is associated with a patch of the bank.

4. The apparatus of claim 2, wherein the logic is associated with a section of the one or more sections.

5. The apparatus of claim 2, wherein the local row control logic and the local sense amplifier control logic of the logic are associated with two or more patches of the bank.

6. The apparatus of claim 2, wherein:
   the local row control logic is associated with a first section of the one or more sections; and
   the buffer is associated with the first section, or a second section of the one or more sections, or both.

7. The apparatus of claim 1, wherein the local row control logic is further operable to:
   receive a second signal from a host device; and
   identify the delay based at least in part on the second signal.

8. The apparatus of claim 1, wherein the delay is based at least in part on an oscillator.

9. The apparatus of claim 1, wherein the logic further comprises a resistor-capacitor circuit to implement the delay.

10. The apparatus of claim 1, wherein the logic comprises CMOS-under-array (CuA) logic positioned under an array of memory cells.

11. An apparatus, comprising:
    a bank group comprising a plurality of banks;
    logic associated with a bank of the bank group, the logic comprising local row control logic, a buffer, local sense amplifier control logic, and a driver; and
    a controller coupled with the bank group and the logic, the controller operable to cause the apparatus to:
       identify, using the local row control logic, a delay between sub-operations of an operation for the bank of the bank group;
       receive, using the buffer, the delay identified by the local row control logic;
       amplify, using the local sense amplifier control logic, a signal associated with the delay; and
       initiate, using the driver, one or more of the sub-operations of the operation based at least in part on the delay stored in the buffer and the signal amplified by the local sense amplifier control logic.

12. The apparatus of claim 11, wherein the controller is further operable to cause the apparatus to:
    receive, using the local row control logic, one or more signals from bank group logic that is associated with the plurality of banks; and
    route information based at least in part on the one or more signals to the buffer, one or more other buffers, the driver, or any combination thereof, wherein initiating the one or more sub-operations is based at least in part on routing the information.

13. The apparatus of claim 12, wherein:
    the bank comprises one or more sections;
    the local row control logic is associated with a first section of the one or more sections; and
    the buffer and the one or more other buffers are associated with the first section, or a second section of the one or more sections that is different than the first section, or both.

14. The apparatus of claim 12, wherein the local row control logic is operable to identify the buffer and the one or more other buffers based at least in part on the one or more signals.

15. The apparatus of claim 11, wherein the controller is further operable to cause the apparatus to:
    identify the delay based at least in part on one or more processes of the bank, one or more characteristics of the bank, a temperature of the bank, or any combination thereof.

16. The apparatus of claim 11, wherein the controller is further operable to cause the apparatus to:
    receive, from a host device, a command to perform the operation, wherein identifying the delay between the sub-operations of the operation is based at least in part on the command.

17. The apparatus of claim 11, wherein the delay comprises a first duration that is shorter than a second duration of a second delay, the second delay between one or more operations performed using the plurality of banks of the bank group.

18. A method, comprising:
    identifying a delay between sub-operations of an operation for a bank of a bank group of a memory device;
    storing the delay in a buffer of the memory device;
    amplifying a signal associated with the delay; and
    initiating one or more of the sub-operations of the operation based at least in part on the delay stored in the buffer and the amplified signal.

19. The method of claim 18, further comprising:
    receiving one or more signals from bank group logic that is associated with the bank group; and
    routing information based at least in part on the one or more signals to the buffer, one or more other buffers, a driver, or any combination thereof, wherein initiating the one or more sub-operations is based at least in part on routing the information.

20. The method of claim 18, further comprising:
receiving, from a host device, a command to perform the operation, wherein identifying the delay between the sub-operations of the operation is based at least in part on the command.

* * * * *